(12) United States Patent
Fujii et al.

(10) Patent No.: US 6,353,278 B1
(45) Date of Patent: Mar. 5, 2002

(54) PIEZOELECTRIC TRANSFORMER HAVING INCREASED VOLTAGE OUTPUT

(75) Inventors: Akira Fujii, Yokkaichi; Takumi Kataoka, Okazaki; Eturo Yasuda, Okazaki; Hitoshi Shindo, Okazaki, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/531,145

(22) Filed: Mar. 17, 2000

(30) Foreign Application Priority Data

Mar. 18, 1999 (JP) .......................... 11-074321
Mar. 7, 2000 (JP) ...................... 2000-062113

(51) Int. Cl.⁷ .............................................. H01L 41/00
(52) U.S. Cl. ................... 310/359; 310/323.09; 310/358
(58) Field of Search ................. 310/359, 358, 310/323.09

(56) References Cited

U.S. PATENT DOCUMENTS 4,639,630 A * 1/1987 Rodloff et al. ............... 310/328
5,345,137 A * 9/1994 Funakubo et al. .......... 310/323
5,872,419 A * 2/1999 Hall et al. ................... 310/359

FOREIGN PATENT DOCUMENTS

JP           11-8420          1/1999

OTHER PUBLICATIONS

"Piezoelectric Ceramic Transducers" by Charles Edmiston, Sep. 1, 1974, Electronic Design, vol. 22 No. 18, pp. 78–82.*

* cited by examiner

Primary Examiner—Brian Sircus
Assistant Examiner—Michael C. Zarroli
(74) Attorney, Agent, or Firm—Pillsbury Winthrop LLP

(57) ABSTRACT

A ceramic piezoelectric transformer is provided which includes a compression mechanism. The compression mechanism is made up of, for example, a bolt and a nut which add a given compressive stress to a transformer body in a lengthwise direction thereof for absorbing a tensile stress arising from oscillations of the transformer body during operation, thereby allowing output energy from the transformer to be increased. In a modified form, a weight block is mounted on an end of the transformer body to increase the range of the output energy.

11 Claims, 3 Drawing Sheets

PIEZOELECTRIC TRANSFORMER HAVING INCREASED VOLTAGE OUTPUT

BACKGROUND OF THE INVENTION

1. Technical Field of the Invention

The present invention relates generally to a ceramic piezoelectric transformer, and more particularly to a ceramic piezoelectric transformer whose matching impedance is low and whose mechanical properties are improved so that a higher voltage may be output.

2. Background Art

Japanese Patent First Publication No. 11-8420 discloses a conventional ceramic piezoelectric transformer. The piezoelectric transformer includes voltage input and output portions. The voltage input portion is responsive to application of voltage to oscillate in an axial direction (i.e., a lengthwise direction) of the transformer, thereby inducing the resonance of the whole of the transformer. The voltage output portion serves to output the voltage and current produced by the resonance.

The above piezoelectric transformer, however, has a drawback that a sufficient voltage is not created. This is for the following reasons.

The output voltage and current of the ceramic piezoelectric transformer depend upon the geometry of the voltage output portion. Specifically, the creation of a higher voltage requires increasing the length of each ceramic piezoelectric element of the voltage output portion. Conversely, decreasing the matching impedance requires shortening each ceramic piezoelectric element of the voltage output portion. It is, thus, difficult to realize ceramic piezoelectric transformers which have a lower matching impedance, but is capable of producing a higher voltage.

Further, creating much voltage requires an increase in size of the transformer.

SUMMARY OF THE INVENTION

It is therefore a principal object of the present invention to avoid the disadvantages of the prior art.

It is another object of the present invention to provide a ceramic piezoelectric transformer whose matching impedance is low and which is capable of creating higher electric energy (e.g., higher voltage) without need of increase in size of the transformer.

According to one aspect of the invention, there is provided a ceramic piezoelectric transformer. The piezoelectric transformer comprises: (a) an input portion responsive to input of given energy to cause the piezoelectric transformer to resonate in a lengthwise direction of the piezoelectric transformer; (b) an output portion connected in alignment with the input portion, the output portion being responsive to resonance of the piezoelectric transformer to output energy in a given form; and (c) a compression mechanism adding a compressive stress to the input and output portions in a lengthwise direction thereof.

In the preferred mode of the invention, the compression mechanism includes a bolt and a nut. The bolt is inserted from an outer end of one of the input and output portions into a hole extending through lengths of the input and output portions. The nut is mounted on an outer end of the other of the input and output portions to fasten the bolt to subject the input and output portions to the compressive stress of a given level.

A weight block may be mounted on an end of one of the input and output portions for increasing the range of the output energy.

According to another aspect of the invention, there is provided a ceramic piezoelectric transformer. The transformer comprises: (a) an input portion responsive to input of given energy to cause the piezoelectric transformer to resonate in a lengthwise direction of the piezoelectric transformer; (b) an output portion connected in alignment with the input portion, the output portion being responsive to resonance of the piezoelectric transformer to output energy in a given form; and (c) a weight block mounted on an end of at least one of the input and output portions.

In the preferred mode of the invention, a compression mechanism may also be provided which adds a compressive stress to the input and output portions in a lengthwise direction thereof to absorb a tensile stress arising from the resonance of the transformer during operation for increasing the output energy.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

DESCRIPTION OF THE PREFERRED EMBODIMENTS

Figure 1:
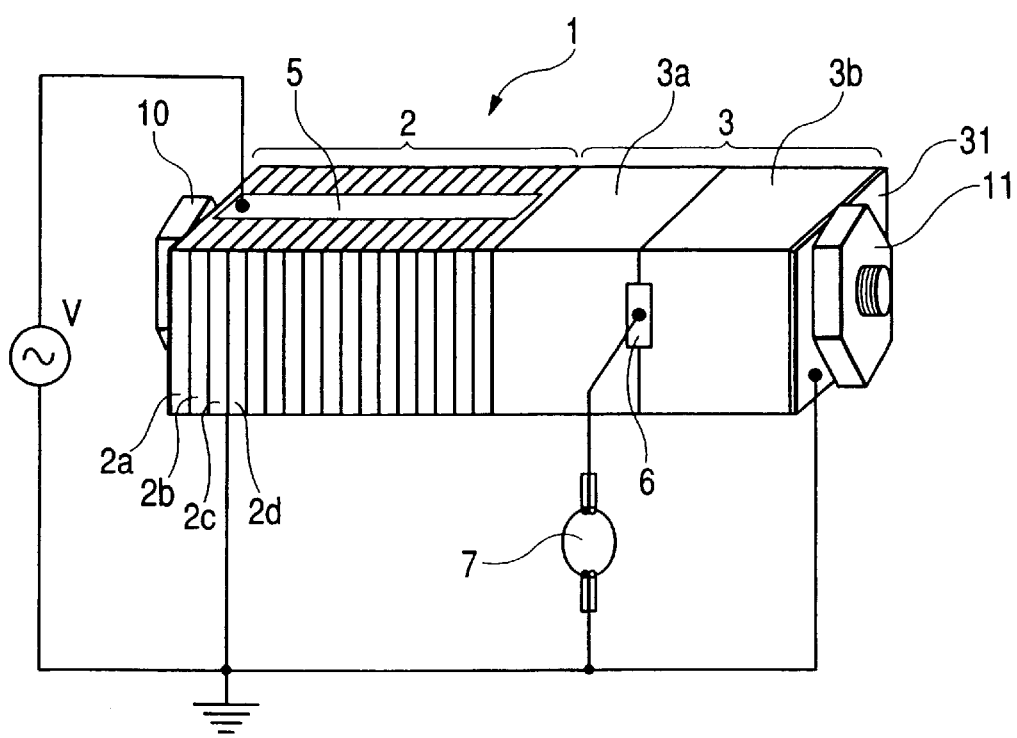
FIG. 1 is a perspective view which shows a ceramic piezoelectric transformer according to the first embodiment of the invention.

Referring now to the drawings, wherein like numbers refer to like parts in several views, particularly to FIG. 1, there is shown a ceramic piezoelectric transformer 1 according to the first embodiment of the invention.

The piezoelectric transformer 1 is made of a ceramic material and designed to be responsive to input of given energy to output energy in a preselected form. The piezoelectric transformer 1 consists of two major parts: a voltage input portion 2 and an output portion 3. The voltage input portion 2 is responsive to application of ac voltage to induce resonance of the whole of the piezoelectric transformer 1. The voltage input portion 2 is made of a laminate of first, second, and third square ceramic elements 2a, 2b, and 2c each of which measures 7×7× about 1 mm thick. Next to the first ceramic element 2a, the second ceramic elements 2b and the third ceramic elements are, as clearly shown in the drawing, laminated alternately so that directions of polarization of the adjacent second and third ceramic elements 2b and 2c may be opposed to each other.

Figure 2:
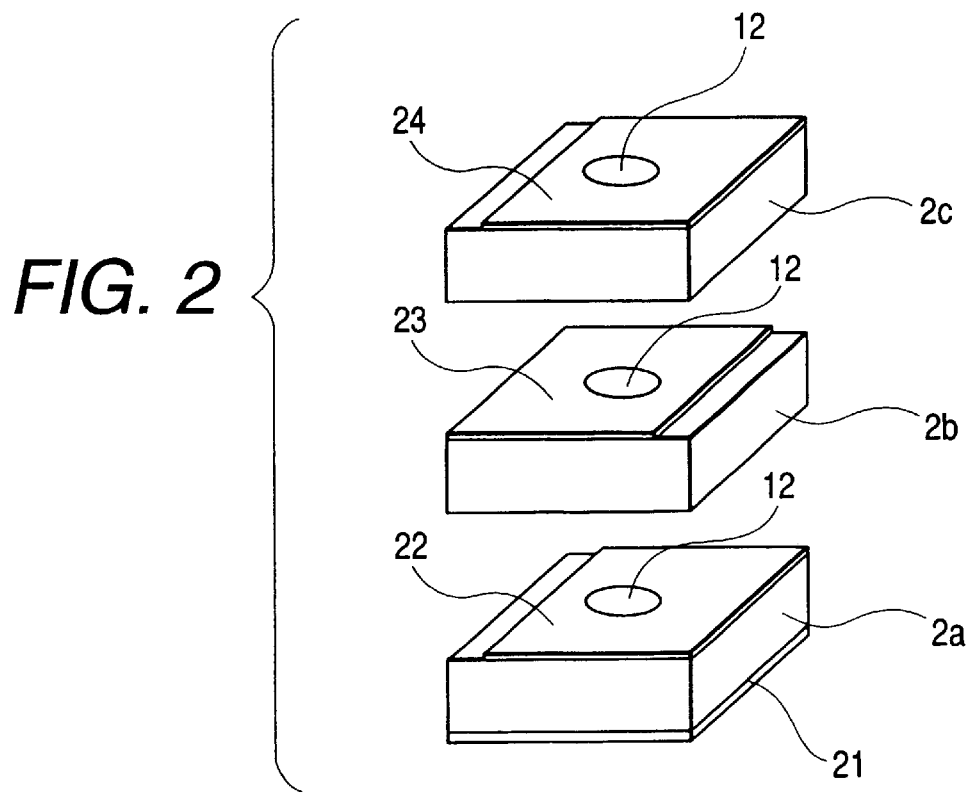
FIG. 2 is a perspective view which shows a first, a second, and a third ceramic element laminated to form a voltage input portion of the transformer shown in FIG. 1.

FIG. 2 is a perspective view which shows the first, second, and third ceramic elements 2a, 2b, and 2c.

The first ceramic element 2a has two electrode 21 and 22. The electrodes 21 is formed over the whole of a surface of the first ceramic element 2a. The electrode 22 is formed on an opposite surface with a peripheral or edge portion exposed.

Each of the second ceramic element 2b has a single electrode 23 formed on a surface with an edge portion exposed.

Each of the third ceramic element 2c, like the second ceramic element 2b, has a single electrode 24 formed on a surface with an edge portion exposed.

The first, second, and third ceramic elements 2a, 2b, and 2c are attached to each other so that the edge portions not covered with the electrodes of adjacent two of the first, second, and third ceramic elements 2a, 2b, and 2c may not be aligned with each other in a lengthwise direction of the piezoelectric transformer 1. Specifically, the electrode 22 of the first ceramic element 2a and the electrode 23 of an adjacent one of the second ceramic elements 2b are shifted laterally in opposite directions. The electrode 23 and the electrode 24 of adjacent two of the second and third ceramic elements 2b and 2c are shifted laterally in opposite directions. In other words, the electrode 22 of the first ceramic element 2a and the electrodes 24 of all the third ceramic element 2c extend up to right edges thereof, as viewed in FIG. 2, while the electrodes 23 of all the second ceramic elements 2b extend up to left edges thereof, as viewed in FIG. 2.

On side surfaces of the first, second, and third ceramic elements 2a, 2b, and 2c thus laminated, a first common electrode 5 is, as shown in FIG. 1, formed which is made of a layer of silver paste. The first common electrode 5 extends in the lengthwise direction of the piezoelectric transformer 1 so as to electrically connect the electrode layers 22 and 24 of the first ceramic element 2a and the third ceramic elements 2c together. The first common electrode 5 connects at one end with a voltage generator V.

On opposite side surfaces of the first, second, and third ceramic elements 2a, 2b, and 2c, a second common electrode (not shown) made of a layer of silver paste is formed, like the first common electrode 5, so as to electrically connect the electrode layers 21 of the first ceramic element 2a and the electrode layers 23 of the second ceramic elements 2b together. The second common electrode is, as clearly shown in FIG. 1, grounded at an end thereof.

The voltage output portion 3 is connected integrally with the voltage input portion 2 in alignment therewith and serves to output the voltage or power resulting from the resonance of the input voltage portion 2. The voltage output portion 3 has the length extending in a direction of lamination of the ceramic elements 2b and 2c of the voltage input portion 2. The voltage output portion 3 is made of a laminate of two square ceramic elements 3a and 3b each of which measures 7×7×9 mm thick. The ceramic elements 3a and 3b are oriented in opposite directions in polarization.

Between opposed end surfaces of the ceramic elements 3a and 3b, an electrode (not shown) is interposed. An electrode 31 is formed over the whole of an end surface of the ceramic element 3b opposite the ceramic element 3a. Further, an output side electrode 6 is attached over side surfaces of the ceramic elements 3a and 3b in electric connection with the electrode disposed between the opposed end surfaces of the ceramic elements 3a and 3b. The output side electrode 6 is grounded through a metal halide lamp 7. Ignition of the metal halide lamp 7 requires initial application of 23 kV. After ignited, the metal halide lamp 7 has the impedance is 200 Ω, receives 85 Vrms, and outputs 35 W.

The piezoelectric transformer 1 of this embodiment has a structural feature that the laminate of the ceramic elements 2a to 2c and the ceramic elements 3a and 3b are compressed in the lengthwise direction of the piezoelectric transformer 1 by a bolt 10 (e.g., a hexagon head bolt) and a nut 11. Specifically, the piezoelectric transformer 1 is always subjected to a compressive pressure of approximately 50 Mpa in the direction of lamination of the ceramic elements 2a, 2b, 2c, 3a, and 3b.

A fabrication method of the piezoelectric transformer 1 will be described below.

First, each of the ceramic elements 2a, 2b, 2c, 3a, and 3b is made. Specifically, a ceramic slurry containing PZT components is prepared and formed into a square plate member for each of the ceramic elements 2a, 2b, 2c, 3a, and 3b. A through hole 12, as clearly shown in FIG. 2 is drilled in the center of each square plate members for insertion of the bolt 10.

On preselected surfaces of the plate members thus formed, the electrodes 21, 22, 23, 24, and 31 and the electrode (not shown) between the ceramic elements 3a and 3b are printed with a silver paste. Subsequently, all the plate members are laminated and then baked at 950° C.

Next, on opposed side surfaces of the laminate thus formed, the first common electrode 5 and the second common electrode (not shown) are printed with a silver paste to connect the electrodes 21 to 24 formed on the ceramic elements 2a, 2b, and 2c.

The above electrodes may alternatively be formed by a paste such as Pt, Ag/Pd, or Cu in view of the baking temperature of the ceramic body (i.e., the laminate of the ceramic elements) and the reactivity thereof against the electrodes.

The voltages of opposed polarities are applied to the first and second common electrodes to polarize the ceramic elements 2b and 2c so that they may have polarities oriented in opposite directions.

The input and output portions 2 and 3 may be made of any piezoelectric ceramic material such as PZT or $BaTiO_3$ which is either monocrystal or polycrystal or a combination of different piezoelectric ceramic materials.

Finally, the bolt 10 is inserted through the holes 12 of all the ceramic elements 2a, 2b, 2c, 3a, and 3b from the ceramic element 2a. The nut 11 is tightened on the electrode layer 31 formed on the end surface of the ceramic element 3b to compress the piezoelectric transformer 1 inward in the lengthwise direction thereof.

The operation of the piezoelectric transformer 1 will be described below.

Usually, each ceramic element of the input and output portions 2 and 3 can withstand the compressive stress, but is easily affected by the tensile stress. It is, thus, important not to subject the ceramic elements to a great tensile stress in normal operating conditions. The piezoelectric transformer 1 of this embodiment is, as described above, subjected to the compressive stress all the time, which serves to absorb the tensile stress arising from the resonance of the piezoelectric transformer 1 created by excitation of the input portion 2. This allows an oscillation range in which the piezoelectric transformer 1 can be oscillated by excitation of the input portion 2 to be widened, thereby allowing an output voltage to be increased. Further, use of the bolt 10 and the nut 11 enables the compressive pressure to be always applied to the piezoelectric transformer 1 without increasing the size thereof.

Figure 3:
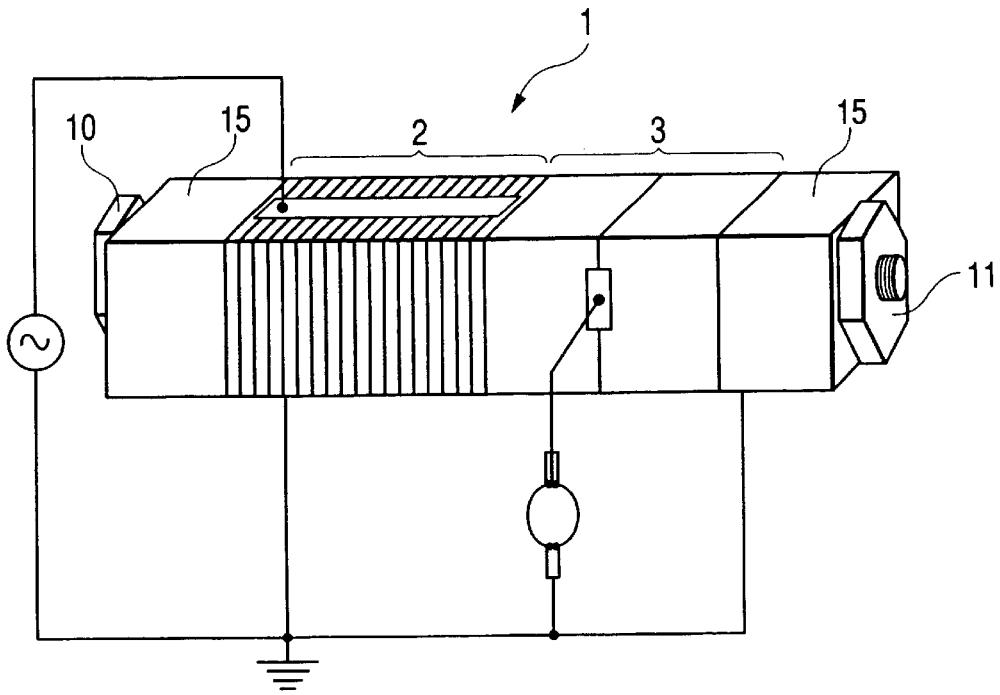
FIG. 3 is a perspective view which shows a ceramic piezoelectric transformer according to the second embodiment of the invention.

FIG. 3 shows a piezoelectric transformer according to the second embodiment of the invention which is different from the one shown in FIG. 1 only in that weights 15 are retained by the bolt 10 and the nut 11 on ends of the voltage input portion 2 and the voltage output portion 3, respectively. Other arrangements are identical, and explanation thereof in detail will be omitted here.

The weights 15 are each made of a cubic metal or ceramic block. The mounting of the weights 15 on the ends of the input and output portions 2 and 3 causes the amplitude of oscillation of the piezoelectric transformer 1 to be increased, thereby allowing the output voltage of the piezoelectric transformer 1 to be increased further.

Figure 4:
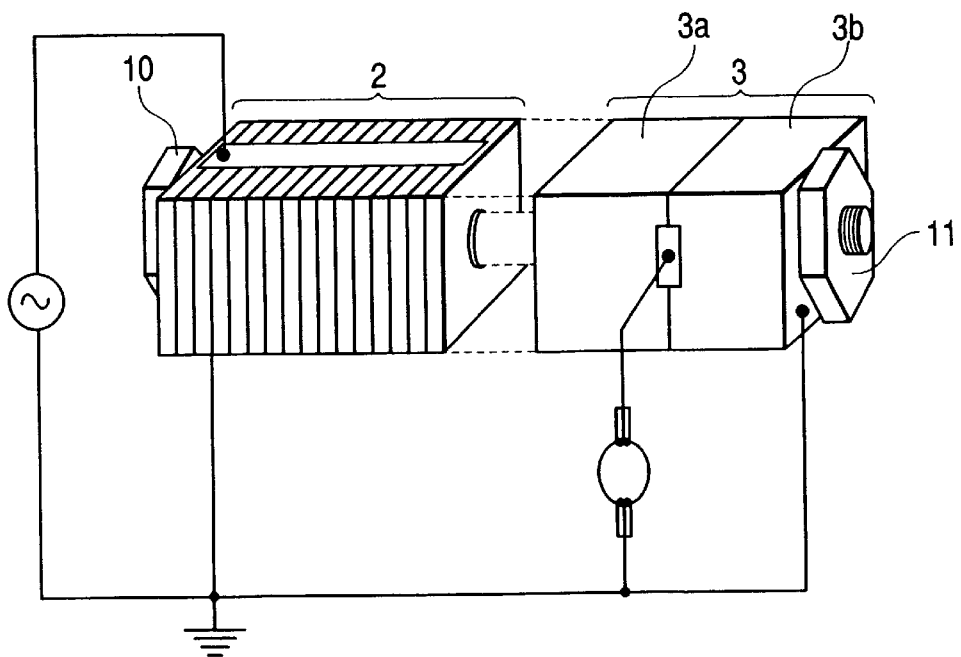
FIG. 4 is a perspective view which shows a first modification of a piezoelectric transformer.

In the above embodiments, the voltage input and output portions 2 and 3 are made of a one-piece baked member, but they may alternatively be made of separate laminates, as shown in FIG. 4, which are baked and then joined by the bolt 10 and the nut 11.

Figure 5:
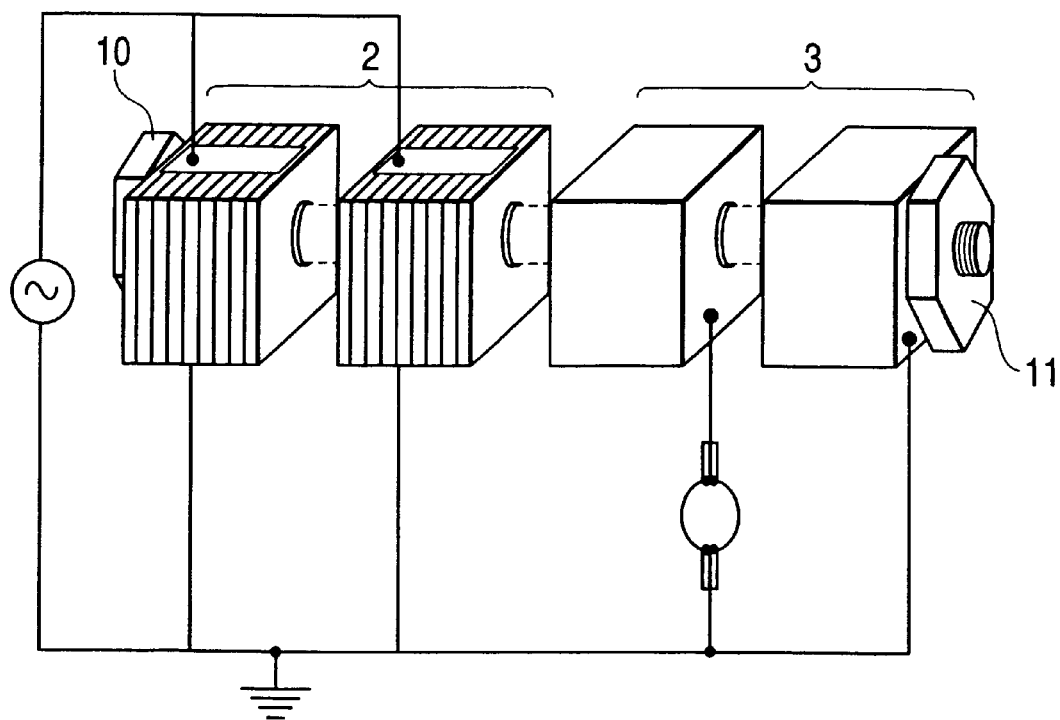
FIG. 5 is a perspective view which shows a second modification of a piezoelectric transformer.

The voltage input and output portions 2 and 3 may also be made of, as shown in FIG. 5, two separate laminates and two separate blocks, respectively, which are baked and then joined by the bolt 10 and the nut 11.

The piezoelectric transformer 1 of the invention is discussed as used to light the metal halide lamp 7, but it may alternatively be used to light any other discharge lamp such as high pressure sodium vapor lamp or xenon lamp.

The bolt 10 and the nut 11 may be replaced with any other fastening means such as a rivet or a metal block with a screw which is capable of adding a given compressive stress to the piezoelectric transformer 1.

The electrodes mounted on the piezoelectric transformer 1 are, as described above, made of a silver paste before the piezoelectric transformer 1 is baked, but they may alternatively be made of any other material such as a mixture of silver and palladium or a mixture of silver and platinum.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

What is claimed is:

1. A ceramic piezoelectric transformer comprising:
    an input portion responsive to input of given energy to cause the piezoelectric transformer to resonate in a lengthwise direction of the piezoelectric transformer;
    an output portion connected in alignment with said input portion, said output portion being responsive to resonance of the piezoelectric transformer to output energy in a given form; and
    a compression mechanism configured to add a compressive stress to said input and output portions in a lengthwise direction to increase the energy output at said output portion.

2. A ceramic piezoelectric transformer as set forth in claim 1, wherein said compression mechanism includes a bolt and a nut, said bolt being inserted from an outer end of one of said input and output portions into a hole extending through lengths of said input and output portions, said nut being mounted on an outer end of the other of said input and output portions to fasten said bolt to subject said input and output portions to the compressive stress of a given level.

3. A ceramic piezoelectric transformer as set forth in claim 1, further comprising a weight block mounted on an end of one of said input and output portions.

4. A ceramic piezoelectric transformer comprising:
    an input portion responsive to input of given energy to cause the piezoelectric transformer to resonate in a lengthwise direction of the piezoelectric transformer;
    an output portion connected in alignment with said input portion, said output portion being responsive to resonance of the piezoelectric transformer to output energy in a given form; and
    a weight block mounted on an end of at least one of said input and output portions to increase the energy output at said output portion.

5. A ceramic piezoelectric transformer as set forth in claim 4, further comprising a compression mechanism adding a compressive stress to said input and output portions in a lengthwise direction thereof.

6. A ceramic piezoelectric transformer as set forth in claim 1, wherein said input portion is made up of a plurality of ceramic elements laminated in the lengthwise direction of the piezoelectric transformer.

7. A ceramic piezoelectric transformer as set forth in claim 6, wherein said compression mechanism provides the compression stress to said input and output portions in a direction of lamination of the ceramic elements of said input portion to increase the energy output by said output portion.

8. A ceramic piezoelectric transformer as set forth in claim 3, wherein the weight block works to apply a mechanical load to said input and output portions during the resonance of the piezoelectric transformer, thereby increasing the energy output said output portion.

9. A ceramic piezoelectric transformer as set forth in claim 4, wherein the weight block works to apply a mechanical load to said input and output portions in a direction of lamination of the ceramic elements of said input portion during the resonance of the piezoelectric transformer, thereby increasing the energy output by said output portion.

10. A ceramic piezoelectric transformer as set forth in claim 1, wherein the energy output by said output portion is at least one of voltage and power.

11. A ceramic piezoelectric transformer as set forth in claim 4, wherein the energy output by said output portion is at least one of voltage and power.

* * * * *